(12) United States Patent
Illek

(10) Patent No.: US 8,811,448 B2
(45) Date of Patent: Aug. 19, 2014

(54) OPTOELECTRONIC COMPONENT

(75) Inventor: Stefan Illek, Donaustauf (DE)

(73) Assignee: OSRAM Opto Semiconductors GmbH (DE)

( * ) Notice: Subject to any disclaimer, the term of this patent is extended or adjusted under 35 U.S.C. 154(b) by 361 days.

(21) Appl. No.: 13/120,752

(22) PCT Filed: Aug. 31, 2009

(86) PCT No.: PCT/DE2009/001222
§ 371 (c)(1),
(2), (4) Date: Apr. 13, 2011

(87) PCT Pub. No.: WO2010/034279
PCT Pub. Date: Apr. 1, 2010

(65) Prior Publication Data
US 2011/0188529 A1    Aug. 4, 2011

(30) Foreign Application Priority Data
Sep. 25, 2008  (DE) .......................... 10 2008 048 903

(51) Int. Cl.
| | |
|---|---|
| *H01S 3/091* | (2006.01) |
| *H01S 5/04* | (2006.01) |
| *H01S 5/183* | (2006.01) |
| *H01S 5/14* | (2006.01) |
| *H01S 5/18* | (2006.01) |
| *H01S 5/00* | (2006.01) |
| *H01S 5/02* | (2006.01) |
| *H01S 5/40* | (2006.01) |
| *H01S 5/022* | (2006.01) |

(52) U.S. Cl.
CPC . *H01S 5/183* (2013.01); *H01S 5/14* (2013.01); *H01S 5/041* (2013.01); *H01S 5/18* (2013.01); *H01S 5/0071* (2013.01); *H01S 5/0217* (2013.01); *H01S 5/0215* (2013.01); *H01S 5/4031* (2013.01); *H01S 5/02272* (2013.01)
USPC .......................................................... 372/70

(58) Field of Classification Search
CPC .................... H01S 5/18–5/18397; H01S 5/041
USPC .......................................................... 372/70
See application file for complete search history.

(56) References Cited

U.S. PATENT DOCUMENTS

| | | |
|---|---|---|
| 6,252,896 B1 | 6/2001 | Tan et al. |
| 6,339,607 B1 | 1/2002 | Jiang et al. |

(Continued)

FOREIGN PATENT DOCUMENTS

| | | |
|---|---|---|
| CA | 2 284 319 A1 | 4/2000 |
| DE | 195 23 267 A1 | 1/1997 |

(Continued)

*Primary Examiner* — Julio J Maldonado
*Assistant Examiner* — Joshua King
(74) *Attorney, Agent, or Firm* — DLA Piper LLP (US)

(57) ABSTRACT

An optoelectronic component includes an optical pump device including a first radiation-generating layer and a first radiation exit area at a top side of the pump device, wherein electromagnetic radiation generated during operation of the pump device is coupled out from the pump device through the first radiation exit area transversely and at least in part non-perpendicularly with respect to the first radiation-generating layer, and a surface emitting semiconductor laser chip including a reflective layer sequence including a Bragg mirror, and a second radiation-generating layer, wherein the surface emitting semiconductor laser chip is fixed to the top side of the pump device, and the reflective layer sequence is arranged between the first radiation exit area and the second radiation-generating layer.

14 Claims, 7 Drawing Sheets

(56) References Cited

U.S. PATENT DOCUMENTS

| | | |
|---|---|---|
| 6,556,610 B1 | 4/2003 | Jiang et al. |
| 7,079,563 B2 * | 7/2006 | Miyachi et al. ............ 372/50.12 |
| 7,633,982 B2 | 12/2009 | Albrecht et al. |
| 2002/0001328 A1 | 1/2002 | Albrecht et al. |
| 2003/0053510 A1 * | 3/2003 | Yuen et al. ....................... 372/96 |
| 2004/0042523 A1 | 3/2004 | Albrecht et al. |
| 2004/0233961 A1 * | 11/2004 | Lutgen ............................ 372/70 |
| 2005/0014349 A1 | 1/2005 | Carey et al. |
| 2005/0058171 A1 | 3/2005 | Albrecht |
| 2006/0002444 A1 * | 1/2006 | Wang et al. .................. 372/50.1 |
| 2006/0018354 A1 | 1/2006 | Albrecht et al. |
| 2006/0056479 A1 * | 3/2006 | Evans et al. ....................... 372/64 |
| 2008/0123699 A1 * | 5/2008 | Lee et al. ........................ 372/22 |
| 2009/0304038 A1 | 12/2009 | Schmid et al. |
| 2009/0304039 A1 | 12/2009 | Lutgen et al. |
| 2011/0228805 A1 * | 9/2011 | Trankle et al. ............. 372/50.11 |

FOREIGN PATENT DOCUMENTS

| | | |
|---|---|---|
| DE | 199 47 853 A1 | 4/2000 |
| DE | 102 23 540 A1 | 12/2003 |
| DE | 600 02 387 T2 | 2/2004 |
| DE | 103 41 085 A1 | 3/2005 |
| DE | 10 2004 036 963 A1 | 12/2005 |
| DE | 10 2006 011 284 A1 | 8/2007 |
| DE | 10 2006 024 220 A1 | 10/2007 |
| GB | 2 264 000 A | 8/1993 |
| JP | 3-257888 A | 11/1991 |
| WO | 2005/048423 A1 | 5/2005 |
| WO | 2006/032252 A1 | 3/2006 |

* cited by examiner

FIG 1
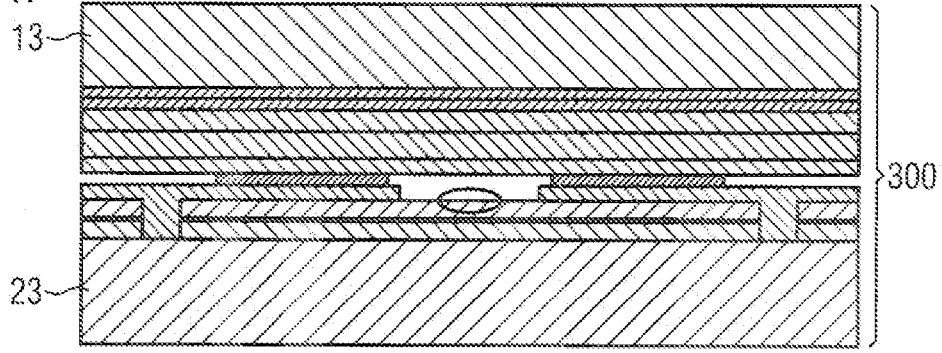
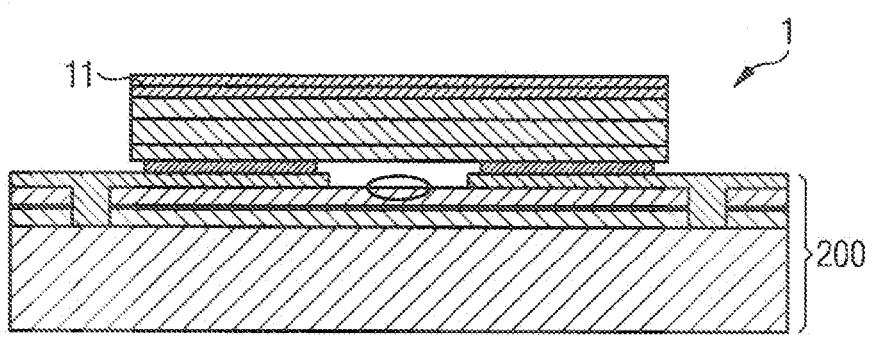
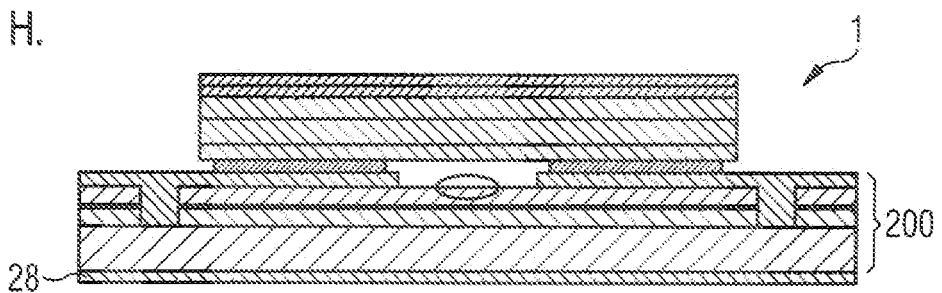
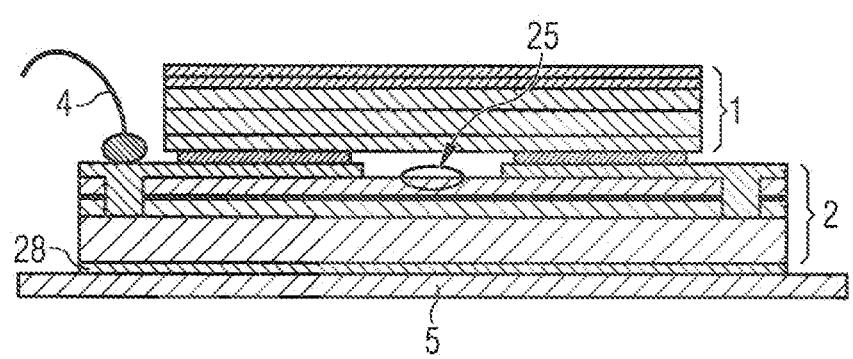

FIG 3
A.
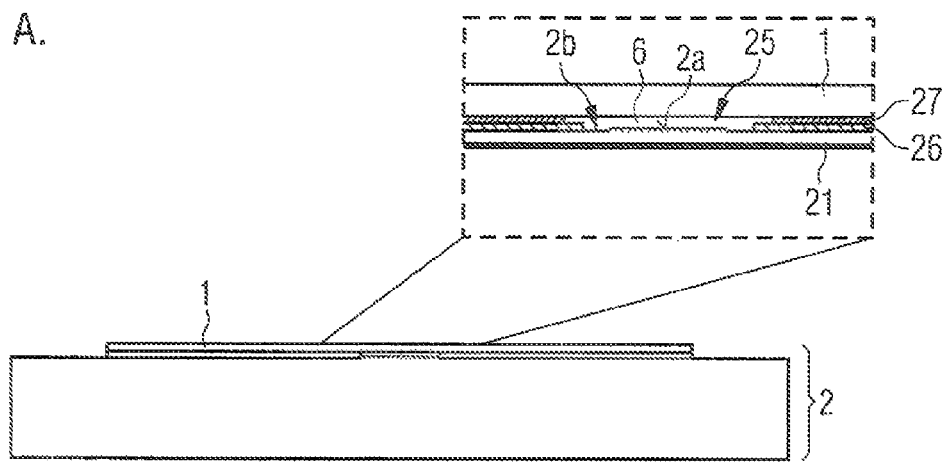
B.
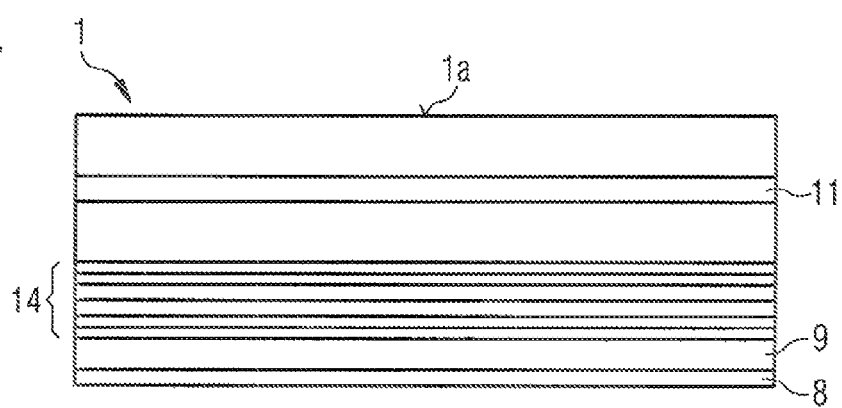

FIG 4
A.
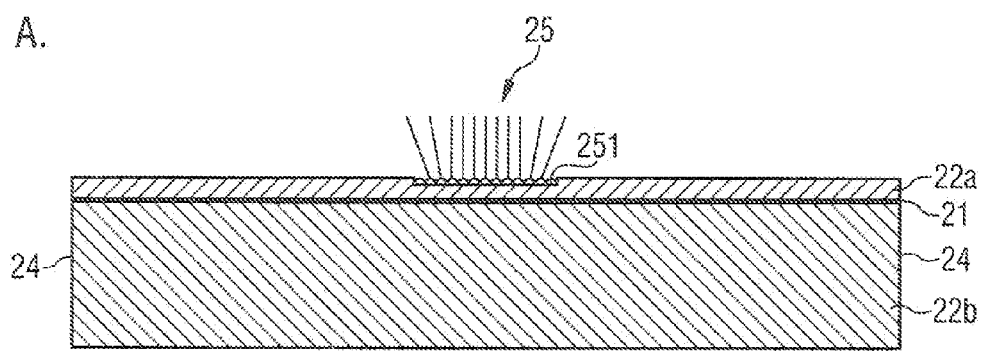
B.
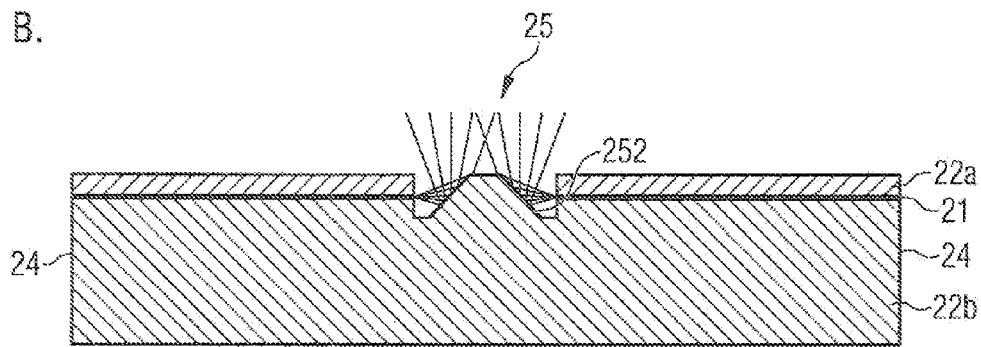

FIG 5
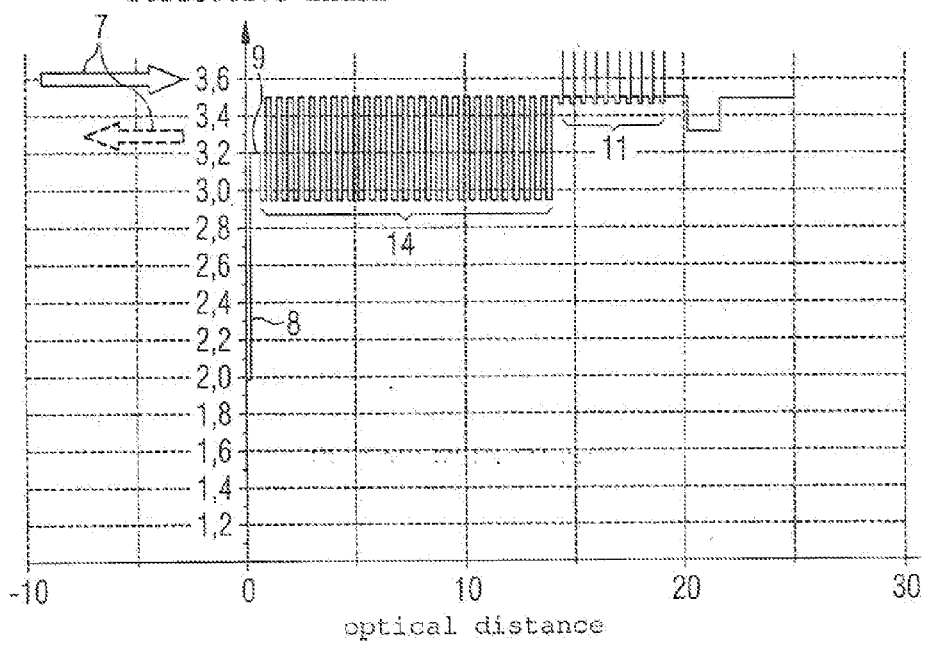
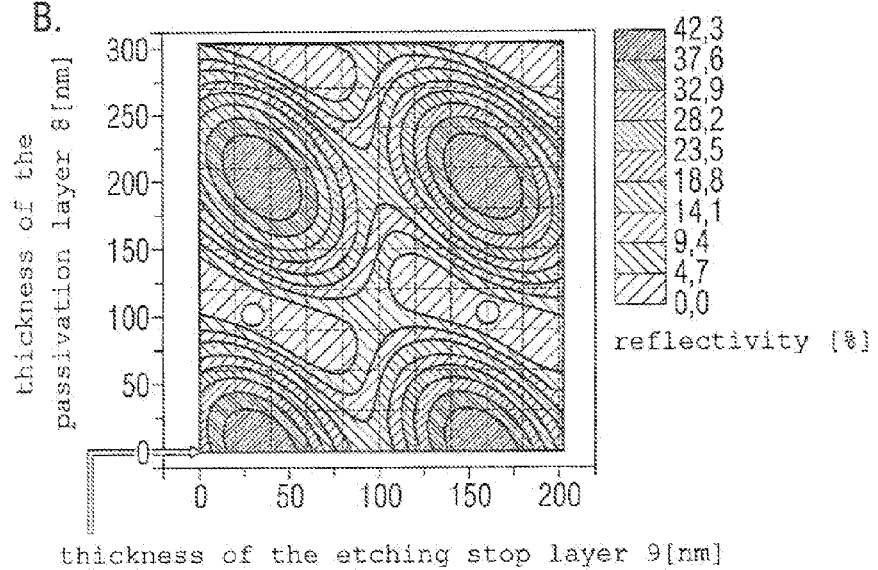

OPTOELECTRONIC COMPONENT

RELATED APPLICATIONS

This is a §371 of International Application No. PCT/DE2009/001222, with an international filing date of Aug. 31, 2009 (WO 2010/034279 A1, published Apr. 1, 2010), which is based on German Patent Application No. 10 2008 048 903.4, filed Sep. 25, 2008, the subject matter of which is incorporated by reference.

TECHNICAL FIELD

This disclosure relates to an optoelectronic component and a method for producing an optoelectronic component.

BACKGROUND

US 2002/0001328 discloses an optoelectronic component. However, it could be helpful to provide an optoelectronic component which can be produced in a particularly simple manner, can be a particularly compact laser light source, and can be produced in a simplified production method.

SUMMARY

I provide an optoelectronic component including an optical pump device including a first radiation-generating layer and a first radiation exit area at a top side of the pump device, wherein electromagnetic radiation generated during operation of the pump device is coupled out from the pump device through the first radiation exit area transversely and at least in part non-perpendicularly with respect to the first radiation-generating layer, and a surface emitting semiconductor laser chip including a reflective layer sequence including a Bragg mirror, and a second radiation-generating layer, wherein the surface emitting semiconductor laser chip is fixed to the top side of the pump device, and the reflective layer sequence is arranged between the first radiation exit area and the second radiation-generating layer.

I also provide a method for producing a optoelectronic component including providing a multiplicity of pump devices present as an assemblage in a first wafer, wherein a first radiation exit area is provided at the top side of each pump device, providing a multiplicity of surface emitting semiconductor laser chips present as an assemblage in a second wafer, connecting first and second wafer such that top sides of the pump devices face a surface emitting semiconductor laser chips, and singulating the connected wafers to form individual optoelectronic components.

BRIEF DESCRIPTION OF THE DRAWINGS

FIG. 3A shows, in a schematic sectional illustration, an example of an optoelectronic component.

FIG. 3B shows, on the basis of a schematic sectional illustration, an example of a surface emitting semiconductor laser chip of an optoelectronic component.

FIGS. 4A and 4B show, in schematic sectional illustrations, examples of a pump device for an example of an optoelectronic component.

DETAILED DESCRIPTION

Figure 1:
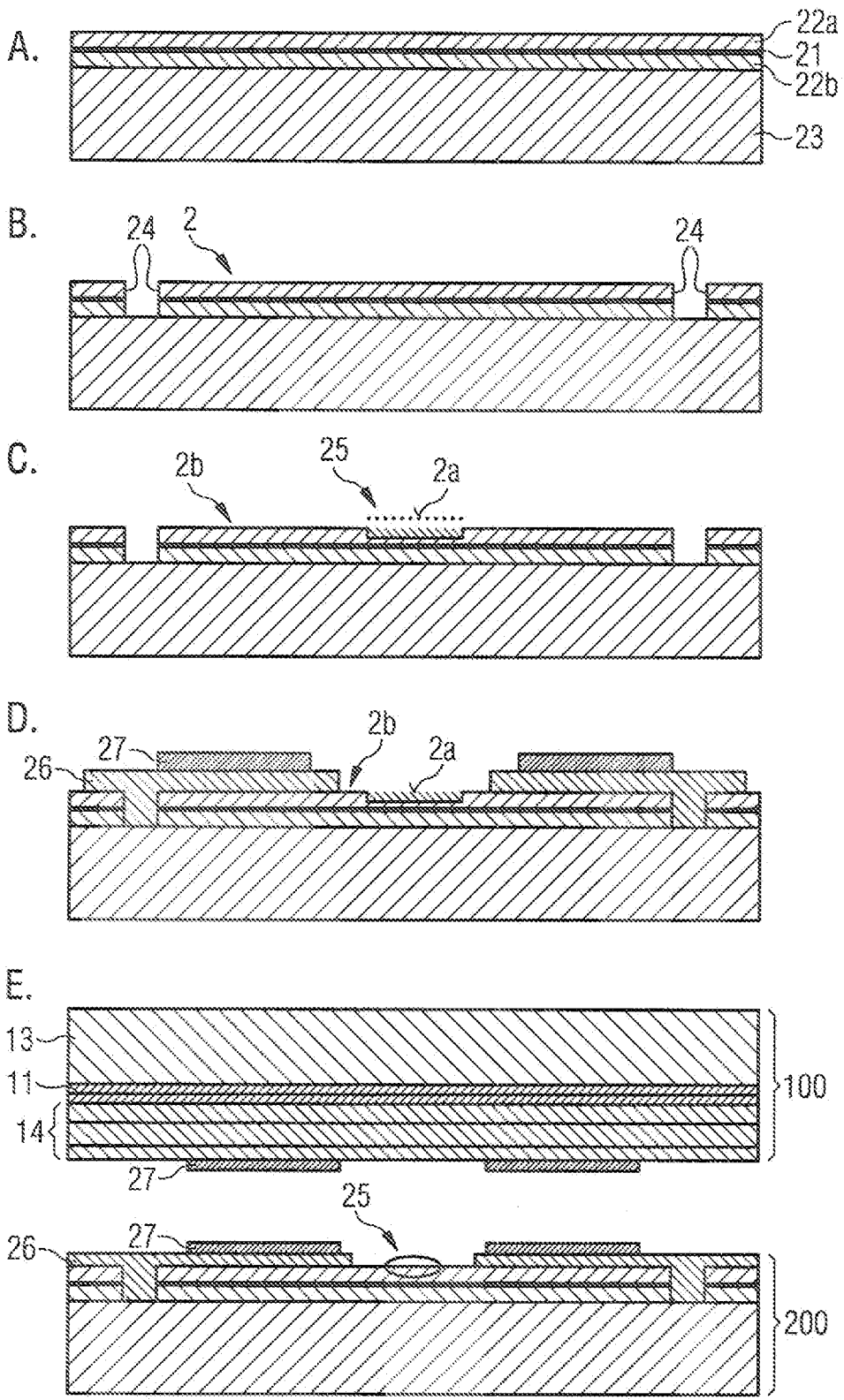
FIGS. 1A to 1H show, on the basis of schematic sectional illustrations, method steps of an example of a method for producing an optoelectronic component.
FIG. 1I shows, on the basis of a schematic sectional illustration, a first example of an optoelectronic component.

The optoelectronic component may comprise an optical pump device. The optical pump device is a semiconductor laser, for example. The optical pump device preferably comprises a first radiation-generating layer of the component. In the first radiation-generating layer, electromagnetic radiation is generated during the operation of the optical pump device. By way of example, the optical pump device is electrically pumped in this case. That is to say that, during the operation of the optical pump device, the latter is operated with electric current, as a result of which electromagnetic radiation is generated in the first radiation-generating layer.

The optical pump device comprises a radiation exit area for coupling out the electromagnetic radiation generated in the radiation-generating layer. The radiation exit area is preferably situated at a top side of the pump device. By way of example, the radiation exit area is provided by part of the outer area of the pump device at its top side. In this case, the radiation exit area runs, for example, parallel or, within the scope of the production tolerance, at least substantially parallel to the first radiation-generating layer. That is to say that, during the operation of the pump device, the electromagnetic radiation generated in the first radiation-generating layer is coupled out from the pump device through the radiation exit area at least in part transversely with respect to the radiation-generating layer. In this case, "transversely" can mean that the electromagnetic radiation is coupled out from the pump device through the radiation exit area at an angle not equal to 90° with respect to the main extension plane of the radiation-generating layer. In this case, part of the radiation coupled out in this way can run perpendicularly to the radiation exit area.

In this case, the radiation exit area of the optical pump device is not necessarily an area actually present in the pump device. Rather, it can also be an imaginary area which runs parallel to the radiation-generating layer and through which the electromagnetic radiation emitted by the pump device during operation passes.

The optoelectronic component may comprise a surface emitting semiconductor laser chip having a reflective layer sequence and a second radiation-generating layer of the component. The surface emitting semiconductor laser chip comprises a radiation exit area, which preferably runs parallel or, within the scope of the production tolerance, substantially parallel to the second radiation-generating layer and to the reflective layer sequence. The second radiation-generating layer is optically pumpable such that the second radiation-generating layer can be pumped by electromagnetic radiation generated in the first radiation-generating layer of the component during the operation of the pump device.

The reflective layer sequence is preferably a layer stack composed of layers having alternately high and low refractive index. By way of example, the reflective layer sequence is a Bragg mirror hereinafter. The reflective layer sequence is reflective for electromagnetic radiation generated in the surface emitting semiconductor laser chip. It can be transmissive for electromagnetic radiation having other wavelengths.

The semiconductor laser chip is a surface emitting semiconductor laser chip, that is to say that a resonator of the semiconductor laser chip is arranged such that the second radiation exit area of the component, that is to say the radiation exit area of the semiconductor laser chip is situated in the resonator or itself forms a part of the resonator mirror of the semiconductor laser chip. By way of example, the radiation exit area is situated at the top side or the underside of the semiconductor laser chip. The resonator can be formed by the reflective layer sequence and an external resonator mirror, wherein the radiation exit area of the semiconductor laser chip is then situated between the reflective layer sequence and the external resonator mirror.

The surface emitting semiconductor laser chip may be fixed to the top side of the pump device. That is to say that the semiconductor laser chip is applied to the pump device at the top side thereof and is mechanically connected to the pump device. In this case, "fixed" also means that the semiconductor laser chip is applied as an independent component onto the pump device. That means that the semiconductor laser chip and the pump device are not monolithically integrated with one another. Therefore, semiconductor laser chip and pump device are not deposited epitaxially onto one another. Rather, the pump device and semiconductor laser chip are produced separately from one another and subsequently connected to one another such that the surface emitting semiconductor laser chip is fixed to the top side of the pump device.

The reflective layer sequence may be arranged between the first radiation exit area and the second radiation-generating layer. That is to say that the surface emitting semiconductor laser chip is fixed, for example, to the top side of the pump device. The radiation exit area of the pump device is also situated at the top side of the pump device such that electromagnetic radiation generated in the pump device first passes through the reflective layer sequence of the surface emitting semiconductor laser chip before it passes into the second radiation-generating layer, which is optically pumped by the electromagnetic radiation.

In other words, the pump radiation of the optical pump device first has to pass through a resonator mirror of the surface emitting semiconductor laser chip to pass into the second radiation-generating layer, which is then optically pumped with the electromagnetic radiation.

The optoelectronic component may comprise an optical pump device which comprises a first radiation-generating layer and a radiation exit area at the top side of the pump device, wherein electromagnetic radiation generated during the operation of the pump device is coupled out from the pump device through the radiation exit area transversely with respect to the first radiation-generating layer. Furthermore, the optoelectronic component may comprise a surface emitting semiconductor laser chip having a reflective layer sequence and a second radiation-generating layer, wherein the surface emitting semiconductor laser chip is fixed to the top side of the pump device and the reflective layer sequence is arranged between the radiation exit area and the second radiation-generating layer.

In the case of an optoelectronic component of this type, it is possible for the pump device and surface emitting semiconductor chip to be produced separately from one another. In this way, each of the two individual optically active elements of the optoelectronic component can be produced by the production method best suited to the respective element. In the case of an optoelectronic component in which optical pump device and surface emitting semiconductor laser chip are monolithically integrated with one another, for example, that is to say deposited epitaxially directly onto one another, for example, it is always necessary, by contrast, to find a compromise, and so neither of the two elements can be produced in the best possible way. Although the monolithic integration of pump device and surface emitting semiconductor laser affords great advantages with regard to mounting the module and permits a significant reduction in the size of the module, such a monolithically integrated surface emitting semiconductor laser requires very complex semiconductor layer structures and compromises with regard to the performance of the components pump device and surface emitting semiconductor laser. Furthermore, a pump laser integrated into the resonator of the surface emitting semiconductor laser makes it more difficult to control the resonator length and thus to set a defined emission wavelength.

Therefore, the optoelectronic component is based on the insight, inter alia, that separate production of optical pump device and surface emitting semiconductor laser chip permits particularly efficient production of the two elements and a particularly precise setting of the emission wavelength of the surface emitting semiconductor laser chip.

The pump device may be formed by an electrically pumped semiconductor laser chip, wherein two resonator mirrors delimit the first radiation-generating layer in a lateral direction. That is to say that the first radiation-generating layer is laterally delimited by two resonator mirrors. The resonator mirrors are formed, for example, by side areas of the pump device. The two side areas are then embodied in reflective fashion in such a way that no or hardly any electromagnetic radiation can pass through them toward the outside. The radiation-generating layer is preferably arranged perpendicularly to the resonator mirrors at least in places. The pump device is therefore, in terms of the basic construction, an edge emitting semiconductor laser chip, but no electromagnetic radiation is coupled out through the edges, that is to say through one of the resonator mirrors, for example. Rather, the pump device preferably comprises a coupling-out structure arranged between the resonator mirrors, for example, in the center of the resonator. That is to say that the coupling-out structure is situated between the resonator mirrors, for example, in a center of the pump device. Laser radiation circulates in the resonator formed by the resonator mirrors, the laser radiation being amplified in the first radiation-generating layer. With the aid of the coupling-out structure, part of the laser radiation is coupled out through the radiation exit area of the pump device, which is arranged at the top side of the pump device.

Furthermore, it is possible for the coupling-out structure itself to form a resonator mirror and the pump device thus to have at least two resonators that are in each case delimited by one of the resonator mirrors and the coupling-out structure.

The resonator mirrors are produced, for example, by etching of the semiconductor body of the pump device. The resonator mirrors can be so-called "retroreflectors." That is to say that, for reflection purposes, the resonator utilizes total internal reflection instead of Fresnel reflection. By way of example, such resonator mirrors are described in WO 2005/048423 for a different optoelectronic component. Therefore, with regard to the resonator mirrors, the subject matter of WO '423 is hereby expressly incorporated by reference.

The pump device may be formed by a semiconductor laser comprising two resonator mirrors that form the resonator of the laser. In this case, the first radiation-generating layer runs perpendicularly to the resonator mirrors. The pump device furthermore comprises a coupling-out structure which is arranged between the resonator mirrors and couples out electromagnetic radiation from the pump device transversely with respect to the radiation-generating layer, in part, for example, perpendicularly to the radiation-generating layer.

An electrically conductive contact layer for the operation of the pump device may be arranged between the pump device and the surface emitting semiconductor laser chip. The electrically conductive contact layer is a metallization, for example, which is applied to the top side of the pump device. With the electrically conductive contact layer, the pump device can then be electrically contact-connected on the p-side, for example. Preferably, the electrically conductive contact layer consists of a metal having good thermal conductivity such as, for example, silver or gold. On account of its arrangement between the pump device and surface emitting semiconductor laser chip, the electrically conductive contact layer can then also serve, along with its electrical properties, for dissipating heat from the surface emitting semiconductor chip. That is to say that heat generated during operation of the surface emitting semiconductor chip can be distributed over a larger area and emitted to the surroundings by the electrically conductive contact layer fitted to the top side of the pump device.

A solder layer may be arranged between the pump device and the surface emitting semiconductor laser chip, by which solder layer the pump device and the surface emitting semiconductor laser chip are mechanically connected to one another. The solder layer is preferably formed with a solder metal. The solder layer can be arranged, for example, on the electrically conductive contact layer for the operation of the pump device. Heat generated by the surface emitting semiconductor laser chip during operation is then dissipated to the contact layer via the solder layer. Furthermore, the distance between the pump device and the surface emitting semiconductor laser chip can be set by way of the height of the electrically conductive contact layer and the height of the solder layer. In this way, the distance can be chosen such that optimum pumping of the second radiation-generating layer by electromagnetic radiation from the first radiation-generating layer is possible.

In this case, the surface emitting semiconductor laser chip is preferably pumped by a so-called "barrier" pumping, in which the pump radiation is absorbed in barrier layers between quantum wells in the second radiation-generating layer.

The surface emitting semiconductor laser chip may have the following layer sequence at its side facing the pump device: a passivation layer, an etching stop layer, the reflective layer sequence. In this case, the passivation layer preferably faces the pump device and the etching stop layer is arranged between the passivation layer and the reflective layer sequence. By way of example, the following layer sequence then arises at the underside, facing the top side of the pump device, of the surface emitting semiconductor chip as seen from the pump device: passivation layer, etching stop layer, reflective layer sequence. In this case, the layers can be arranged directly on one another such that no other layers are situated between these layers.

The passivation layer may be formed with a dielectric, for example, silicon nitride, or consists of a dielectric, for example, silicon nitride. The passivation layer then has electrically insulating properties such that no electric current can be impressed into the surface emitting semiconductor laser chip via, for example, the electrically conductive contact layer and the solder layer between pump device and surface emitting semiconductor laser chip. In this case, the passivation layer can directly adjoin the solder layer such that the following sequence arises between pump device and surface emitting semiconductor laser chip: electrically conductive contact layer, solder layer, passivation layer.

The etching stop layer is formed with InGaP or consists of this material. The etching stop layer serves, for example, as a stop layer for the detachment of a growth substrate from the epitaxially grown layers of the surface emitting semiconductor laser chip. After detachment of the growth substrate, at the place of the growth substrate the passivation layer can be applied to the etching stop layer, for example, by sputtering.

The layer sequence composed of passivation layer and etching stop layer and reflective layer sequence is chosen in such a way that it has a transmissivity of more than 85%, preferably of at least 90%, particularly preferably of at least 98%, for electromagnetic radiation coupled out from the pump device.

Such a high transmissivity for electromagnetic radiation coupled out from the pump device can be achieved by a suitable choice of the materials and of the thicknesses of passivation layer and etching stop layer. Examples of a suitable choice of materials and of suitable thicknesses of the layers are specified further below. With such a layer sequence composed of passivation layer, etching stop layer and reflective layer sequence, it is possible to optically pump the surface emitting semiconductor laser chip through the reflective layer sequence.

The solder layer may enclose the radiation exit area of the pump device in a frame-like manner. That is to say that the solder layer is led as a track composed of solder material around the radiation exit area of the pump device. In this case, "in a frame-like manner" does not refer to the geometry of the solder layer, that is to say that the solder layer need not necessarily be embodied in the manner of a rectangle. It can, for example, also have a round or an oval form. The fact of the solder layer being led around the radiation exit area of the pump device results in a particularly large-area connection between pump device and surface emitting semiconductor laser chip, which further increases the mechanical stability of the optoelectronic component.

A gap may be arranged between the first radiation exit area of the pump device and the surface emitting semiconductor laser chip, the gap being filled with a material having a refractive index of <2.0. By way of example, the gap can be filled with air. The thickness of the gap determines the distance between surface emitting semiconductor laser chip and pump device. On account of the gap between radiation exit area and surface emitting semiconductor laser chip which is filled with a material having a refractive index of <2.0, improved coupling-in of electromagnetic radiation can result on account of the jump in refractive index when electromagnetic radiation emerges from the pump device toward the gap and when electromagnetic radiation enters from the gap into the surface emitting semiconductor laser chip.

Furthermore, a method for producing an optoelectronic component is provided. The optoelectronic component can preferably be produced by the method. That is to say that all features described in conjunction with the optoelectronic component are also disclosed for the method for producing the optoelectronic component, and vice-versa.

The method may comprise a step in which a multiplicity of pump devices present as an assemblage in a first wafer are provided, wherein a radiation exit area is provided at the top side of each pump device. The pump devices are preferably present in the wafer assemblage. For this purpose, the pump devices are epitaxially deposited, for example, onto a growth substrate.

In a structuring method such as an etching process, for example, resonator mirrors are produced in the wafer with the multiplicity of pump devices. As a result of the production of resonator mirrors, individual pump devices are defined in the wafer. Afterward or before production of the resonator mirrors, a coupling-out structure is produced from which electromagnetic radiation can emerge from the pump device through the radiation exit area. Preferably, precisely one coupling-out structure is produced for each pump device.

In accordance one method for producing an optoelectronic component, the method comprises a step in which a multiplicity of surface emitting semiconductor laser chips present as an assemblage in a second wafer are provided. That is to say that the surface emitting semiconductor laser chips are also applied, for example, to a common growth substrate or a carrier. Preferably, the number of surface emitting semiconductor laser chips corresponds to the number of pump devices. That means that, in the course of the production method, a surface emitting semiconductor laser chip can be uniquely assigned to each pump device.

The method may comprise a step in which first and second wafers are connected to one another in such a way that the top sides of the pump devices face the surface emitting semiconductor laser chips. In this case, the connection of the first and second wafers can take place with a wafer bonding process. By way of example, solder material arranged between the top sides of the pump devices and the surface emitting semiconductor laser chips is soldered by laser radiation directed onto the solder material by the pump devices and/or the surface emitting semiconductor laser chips. Alternatively, the connection can be effected by thermocompression.

The method for producing the optoelectronic component may comprise a step in which the connected wafers comprising pump devices and surface emitting semiconductor laser chips are singulated to form individual optoelectronic components. That means that the connected wafers first comprise a multiplicity of optoelectronic components in which each component comprises a pump device and a surface emitting semiconductor laser chip. By singulation, for example, along an interspace between two resonator mirrors of adjacent pump devices, the assemblage of the wafers is separated to form individual optoelectronic components. This can be done by sawing, breaking or laser cutting, for example.

The method for producing an optoelectronic component may comprise the following steps:
  providing a multiplicity of pump devices present as an assemblage in a first wafer, wherein a radiation exit area is provided at the top side of each pump device,
  providing a multiplicity of surface emitting semiconductor laser chips present as an assemblage in a second wafer,
  connecting first and second wafers such that the top sides of the pump devices face the surface emitting semiconductor laser chips, and
  singulating the connected wafers to form individual optoelectronic components.

With the aid of the method described here, a multiplicity of optoelectronic components can be produced in a particularly simple manner. The optoelectronic components are in this case each composed of separately produced pump devices and surface emitting semiconductor laser chips. In this way, the pump devices and the surface emitting semiconductor laser chips can each be produced in the optimum manner for the individual component, without having to take account of the production of the respective other component. In this case, the pump devices comprise a radiation exit area which can emit perpendicularly or at least transversely with respect to the surface of the wafer in which the multiplicity of pump devices are situated. That is to say that the radiation exit areas of the pump devices are in each case arranged at the top side of the wafer.

On account of the fact that the pump devices and the surface emitting semiconductor laser chips are produced separately from one another, no current conduction has to take place through the surface emitting semiconductor laser chip during the operation of the completed optoelectronic component. For this reason, the reflective layer sequence of each surface emitting semiconductor laser chip can be embodied in an undoped fashion. Optical losses on account of a doping can thus be avoided.

By way of example, a soldering process is used to connect the multiplicity of pump devices to the multiplicity of surface emitting semiconductor laser chips. That is to say that first and second wafers are soldered to one another, for example.

To provide the multiplicity of pump devices, first, a semiconductor laser structure comprising a first radiation-generating layer is deposited epitaxially on a growth substrate and a multiplicity of resonator mirrors are subsequently produced in the semiconductor laser structure by etching. That is to say that the pump devices are produced jointly in a wafer. The individual pump devices are defined by etching of the resonator mirrors still on the growth substrate. The resonator mirrors are therefore etched mirrors. In this way, it is advantageously possible to produce a multiplicity of pump devices each comprising a first radiation-generating layer which, in each pump device, has the same construction as in the other pump devices of the wafer assemblage.

A coupling-out structure may be produced to define the radiation exit area of the multiplicity of pump devices between two resonator mirrors in each case. The coupling-out structure can be produced, for example, by the production of oblique reflectors which reflect part of the generated electromagnetic radiation toward the radiation exit area.

Furthermore, production of a coupling-out structure is also possible by altering the refractive index of the semiconductor laser structure of each pump device below the radiation exit area. This can be effected, for example, by a second-order grating or by coupling principles such as, for example, butt coupling with an air gap.

A refractive index grating in the optical field of a waveguide leads to partial reflections of the propagating electromagnetic wave at discontinuity points, for example, a Bragg reflector. In many applications, in this case a first-order grating is used in which an outgoing wave is partly reflected into the reflected-back wave, for example, in the case of a DFB laser or DBR laser. In the case of a second-order grating, the partial reflection takes place perpendicularly to the original propagation direction and such a second-order grating can therefore be used for coupling out electromagnetic radiation transversely with respect to the propagation direction.

The optoelectronic component described here and the method for producing an optoelectronic component described here will be explained in greater detail below by examples and the associated figures.

Elements which are identical, of identical type or act identically are provided with the same reference symbols in the figures. The figures and the size relationships of the elements illustrated in the figures among one another should not be regarded as to scale. Rather, individual elements may be illustrated with an exaggerated size to enable better illustration and/or to afford a better understanding.

The schematic sectional illustrations in FIGS. 1A to 1I show method steps of an example of a method for producing an optoelectronic component. In this case, the component is produced in a manner described in conjunction with at least one of the examples presented above.

As can be gathered from FIG. 1A, first, a growth substrate 23 is provided, on which a semiconductor layer sequence 22*a*, 22*b*, 21 is deposited epitaxially. The semiconductor layer sequence comprises, for example, a first radiation-generating layer 21, which is surrounded by an n-doped layer 22*b* and a p-doped layer 22*a*. The radiation-generating layer 21 is suitable upon energization to generate electromagnetic radiation which is used, in the later optoelectronic component, as pump radiation for the surface emitting semiconductor chip 1.

The totality of growth substrate 23, n-doped layer 22A, p-doped layer 22B and first radiation-generating layer 21 forms a first wafer 200 and, hence, the starting wafer for the production method.

In a subsequent method step as shown in FIG. 1B, resonator mirrors 24 are produced by etching, the resonator mirrors laterally delimiting the radiation-emitting layer 21. In this case, the resonator mirrors 24 preferably run perpendicularly to the first radiation-generating layer 21. Individual pump devices 2 are defined by production of the resonator mirrors 24.

A further method step, which takes place after production of the resonator mirrors 24, for example, is described in conjunction with FIG. 1C. In this method step, a coupling-out structure 25 is produced in each of the pump devices 2. This is illustrated only schematically in FIG. 1C. The coupling-out structures 25 are explained in greater detail by way of example in FIGS. 4A and 4B.

In a fourth method step, a p-type contact layer 26 is applied to the top side 2b of the pump devices 2. In this case, an exit window is left free in the region of the first radiation exit area 2a, in which the top side 2b of the pump device remains uncovered by the p-type contact layer 26. A solder layer 27 is applied to that side of the p-type contact layer 26 which is remote from the pump device 2.

In a further method step, as is shown schematically in conjunction with FIG. 1E, a second wafer 100 is applied to the first wafer 200. The second wafer 100 comprises a multiplicity of surface emitting semiconductor chips 1. In this case, the surface emitting semiconductor chips 1 are still arranged in the assemblage in the wafer.

The second wafer 100 comprises, for example, a substrate 13, a second radiation-generating layer 11, which is applied to the substrate 13, and also a reflective layer sequence 14. A solder layer 27 can likewise be arranged at that side of the reflective layer sequence 14 which is remote from the second radiation-generating layer 11, the solder layer being applied in structured fashion such that the solder layer 27 on the second wafer 100 and the solder layer 27 on the first wafer 200 can be brought into congruence and contact with one another. In this way, first wafer 100 and second wafer 200 can be mechanically connected to one another to form the assemblage of first and second wafers 300 by a wafer bonding process.

In the region of the coupling-out structures 25, first wafer 200 and second wafer 100 are in each case free of contact layers or solder layers. In this way, electromagnetic radiation can pass from the pump devices 2 into the respectively assigned surface emitting semiconductor chip 1.

In a further method step, as is described schematically in conjunction with FIG. 1G, the substrate 13 of the second wafer 100 is removed and individual surface emitting semiconductor chips are defined by mesa etching.

In the next method step as shown in FIG. 1H, an n-type contact layer 28 is applied over the whole area onto the first wafer, at its side remote from the surface emitting semiconductor laser chips 1. The substrate 3 can additionally be thinned beforehand.

In the last method step as shown in FIG. 1I, the first wafer 200 is also severed in the vicinity of the resonator mirrors 24, thus giving rise to optoelectronic components having in each case precisely one pump device 2 and precisely one surface emitting semiconductor chip 1.

An individual optoelectronic component can be applied, for example, to a connection carrier, for example, a printed circuit board, and can be electrically conductively connected to the connection carrier by means of the n-type contact layer 28 and a wire contact 4. In this case, the optoelectronic component forms a surface emitting semiconductor laser, wherein the optical pump device 2 optically pumps the surface emitting semiconductor chip by electromagnetic radiation coupled out via the coupling-out structure 25.

Figure 2:
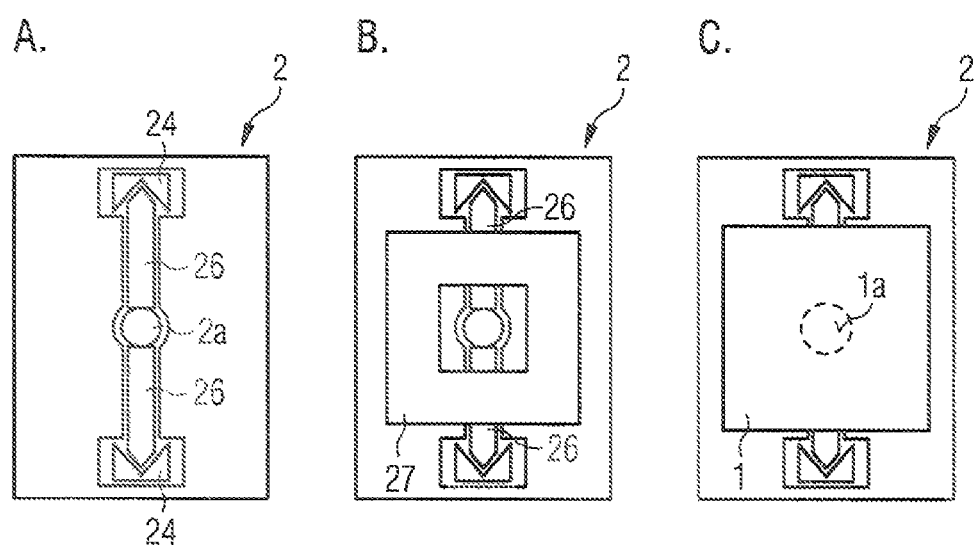
FIGS. 2A to 2C show, on the basis of schematic plan views, a second example of a method for producing an optoelectronic component.

In the schematic plan views in FIGS. 2A to 2C, method steps of a further example of a production method are explained in greater detail. As can be seen from FIG. 2A, the reflector mirrors 24 can be formed by retroreflectors. In this case, FIG. 2A shows a schematic plan view of a pump device 2 before the solder layer 27 is applied. The first radiation exit area 2a, through which electromagnetic radiation can leave the pump device 2 during operation, is situated in the center of the resonator formed by the resonator mirrors 24.

Afterward as shown in FIG. 2B, a solder layer 27 is applied in a frame-like manner around the first radiation exit area 2a. In this case, the solder layer 27 is in direct contact with the p-type contact layer 26.

In a further method step, a surface emitting semiconductor laser chip 1 is applied to the solder layer 27 and thereby connected to the pump device 2. The surface emitting semiconductor laser chip 1 comprises a second radiation exit area 1a, through which electromagnetic radiation generated in the second radiation-generating layer 11 leaves the optoelectronic component.

On the basis of the sectional illustration in FIG. 3A, an example of an optoelectronic component is explained in greater detail. The component comprises a pump device 2 and also a surface emitting semiconductor laser chip 1. In the region of the coupling-out structure 25, the optoelectronic component is illustrated in an excerpt enlargement. The component comprises the first radiation-generating layer 21 and also a coupling-out region 25 at the top side 2b of the pump device 2. In the region of the coupling-out structure 25, a gap 6 is arranged between pump device 2 and surface emitting semiconductor chip 1, the gap being filled with a material having a refractive index of ≤2. By way of example, the gap 6 is filled with air. The distance between pump device 2 and surface emitting semiconductor laser chip 1 is set by the height of the p-type contact layer 26 and of the solder layer 27.

The width of the optoelectronic component formed in this way is, in a lateral direction, for example, between 850 μm and 950 μm, preferably 900 μm. The height is preferably between 100 μm and 130 μm, for example, 115 μm. The first radiation exit area 2a preferably has a diameter of at least 40 μm and at most 500 μm. By way of example, the diameter is between 100 μm and 150 μm, preferably between 70 μm and 130 μm. The thickness of the surface emitting semiconductor laser chip 1 is preferably at least 6 μm and at most 10 μm, for example, 8 μm. The thickness of the solder layer 27 is preferably between 1.5 μm and 2.5 μm, for example, 2 μm. The thickness of the p-type contact layer is preferably approximately 1 μm.

As can be gathered from FIG. 3B, the surface emitting semiconductor laser chip in accordance with one example comprises the following layer sequence: a passivation layer 8, which faces the first radiation exit area 2a. An etching stop layer 9 is arranged in a manner succeeding the passivation layer 8 at its side remote from the first radiation exit area 2a. The etching stop layer 9 is arranged between the passivation layer 8 and the reflective layer sequence 14, which is formed by a Bragg mirror, for example.

FIGS. 4A and 4B show, on the basis of schematic sectional illustrations, two examples of a pump device 2 that can be used in an optoelectronic component. In the example in FIG. 4a, the coupling-out region 25 is formed by a second-order surface grating 251.

In the example in FIG. 4B, the coupling-out region 25 is formed by oblique, for example, dry-etched reflectors formed by semiconductor layers running at an angle of not equal to 90° with respect to the first radiation-generating layer 21. By way of example, the resonator can be divided by the reflectors 252, such that the pump device comprises two independent laser resonators. Furthermore, it is possible that only part of the electromagnetic radiation circulating in the laser resonator formed precisely by the reflectors 24 is coupled out by the reflectors 252, such that the pump device 1 has a single laser resonator.

Figure 5:
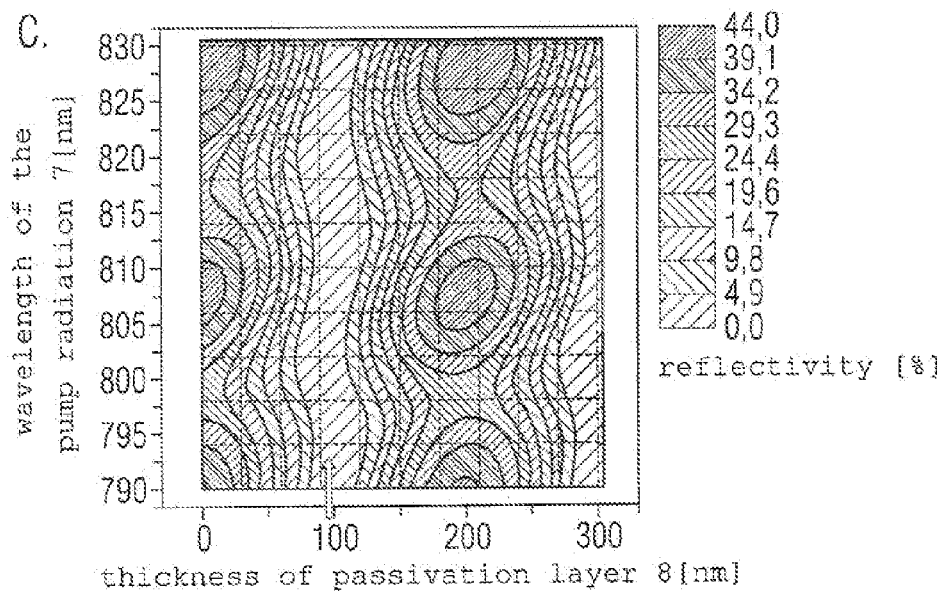
FIGS. 5A to C and 6 show, on the basis of schematic plots, possibilities for determining parameters for a reflective layer sequence that is transmissive to pump radiation.

In conjunction with FIGS. 5A, 5B and 5C, a more detailed explanation is given of how the reflective layer sequence 14 can be modified with the aid of the passivation layer 8 and the etching stop layer 9 in such a way that electromagnetic pump radiation 7 can pass from the pump device 2 through the reflective layer sequence 14 to the second radiation-generating layer 11. In this case, the passivation layer 8 is formed from a silicon nitride. The etching stop layer 9 is formed from InGaP, for example. The etching stop layer 9 serves for separating a growth substrate from the epitaxially grown layers of the surface emitting semiconductor laser chip 1. It has now been found that, for specific thickness combinations of the passivation layer 8 and the etching stop layer 9, the reflective layer sequence can be made transparent to electromagnetic radiation 7 from the pump device 2.

That is to say that the proportion of the radiation which is reflected is then particularly small. FIG. 5A schematically shows the refractive index profile of the layers of the surface emitting semiconductor laser chip 1 plotted against the optical distance. FIG. 5B shows the reflectivity for electromagnetic radiation having a wavelength of 808 nm as a function of the thickness of the etching stop layer 9 and the thickness of the passivation layer 8. As indicated by the arrow, the reflectivity for the pump radiation 7 without the passivation layer 8 is >15%. Through a skilful choice of the thickness of the passivation layer 8 and the thickness of the etching stop layer 9, it is possible to achieve a high transparency of the reflective layer sequence 14. Favorable combinations are, for example, a thickness of the etching stop layer of 30 nm in conjunction with a thickness of the passivation layer 8 of 100 nm, or a thickness of the etching stop layer 9 of 160 nm in conjunction with a thickness of the passivation layer 8 of 100 nm.

In FIG. 5C, the reflectivity for the pump radiation 7 in conjunction with a thickness of the etching stop layer of 160 nm is plotted as a function of the wavelength of the pump radiation 7 and the thickness of the passivation layer 8. It is evident that, in this example, for a thickness of the passivation layer of 100 nm, the reflectivity of the Bragg mirror for the pump light becomes almost zero largely independently of the wavelength of the pump light.

Figure 6:
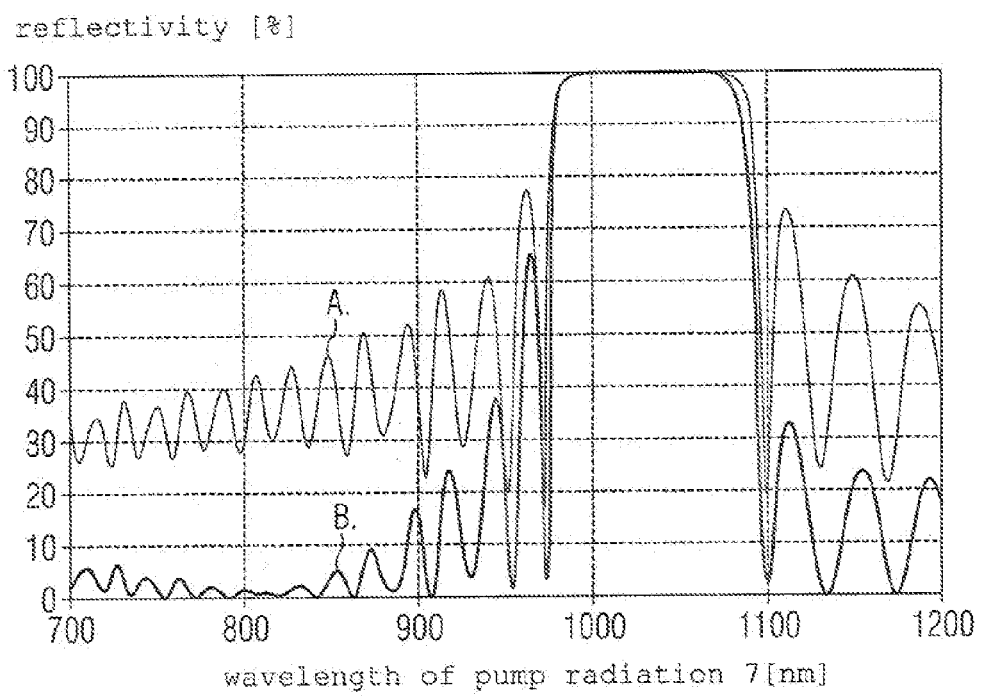

FIG. 6 shows a plot of the reflectivity for the pump radiation 7 against the wavelength of the pump radiation. In this case, curve A shows the reflectivity without a passivation layer 8 in conjunction with a thickness of the etching stop layer of 160 nm, and curve B shows the reflectivity for a thickness of the passivation layer 8 of 100 nm in conjunction with a thickness of the etching stop layer 9 of 160 nm. FIG. 6 also reveals here that hardly any dependence of the reflectivity on the wavelength of the pump light 7 can be ascertained in the range between 800 and 830 nm of the wavelength of the pump radiation 7. For the stated thickness combination of passivation layer 8 and etching stop layer 9, the pump light can therefore penetrate in a particularly unimpeded manner into the second radiation-generating layer 11 of the surface emitting semiconductor laser chip 1.

This disclosure is not restricted to the examples as they are described on the basis thereof. Rather, the disclosure encompasses any novel feature and also any combination of features, which in particular includes any combination of features in the appended claims, even if this feature or this combination itself is not explicitly specified in the claims or examples.

The invention claimed is:

1. An optoelectronic component comprising:
   an optical pump device formed by an electrically pumped semiconductor laser chip and comprising a first radiation-generating layer, a single laser resonator and a first radiation exit area at a top side of the pump device, wherein electromagnetic radiation generated during operation of the pump device is coupled out from the pump device through the first radiation exit area transversely and at least in part non-perpendicularly with respect to the first radiation-generating layer, and
   a surface emitting semiconductor laser chip comprising a reflective layer sequence comprising a Bragg mirror, and a second radiation-generating layer, wherein
   1) the surface emitting semiconductor laser chip is fixed to the top side of the pump device,
   2) the reflective layer sequence is arranged between the first radiation exit area and the second radiation-generating layer,
   3) two resonator mirrors delimit the first radiation-generating layer in a lateral direction,
   4) the two resonator mirrors run perpendicularly to the first radiation-generating layer at least in places,
   5) the surface emitting semiconductor laser chip has the following layer sequence at a side facing the pump device:
   a passivation layer formed with a dielectric layer,
   an etching stop layer, and
   the reflective layer sequence wherein
   the passivation layer is arranged facing the pump device and the etching stop layer is arranged between the passivation layer and reflective layer sequence,
   6) the layer sequence has a transmissivity of at least 85% for electromagnetic radiation coupled out from the pump device,
   7) each of said two resonator mirrors is located in a recess formed in semiconductor layers of the electrically pumped semiconductor laser chip,
   8) the resonator mirrors are covered by a p-contact metal in said recesses, and
   9) in a lateral direction, the p-contact metal is completely surrounded by the semiconductor layers of the electrically pumped semiconductor laser chip.

2. The optoelectronic component according to claim 1, wherein an electrically conductive contact layer for the operation of the pump device is arranged between the pump device and the surface emitting semiconductor laser chip.

3. The optoelectronic component according to claim 1, wherein a solder layer is arranged between the pump device and the surface emitting semiconductor laser chip, by which solder layer the pump device and the surface emitting semiconductor laser chip are mechanically connected to one another.

4. The optoelectronic component according to claim 3, wherein the solder layer encloses the first radiation exit area in a frame manner.

5. The optoelectronic component according to claim 1, wherein a gap is arranged between the first radiation exit area and the surface emitting semiconductor laser chip, said gap being filled with a material having a refractive index of <2.0.

6. The optoelectronic component according to claim 5, wherein the gap is filled with air.

7. A method for producing the optoelectronic component according to claim 1 comprising:
providing a multiplicity of pump devices present as an assemblage in a first wafer, wherein a first radiation exit area is provided at the top side of each pump device,
providing a multiplicity of surface emitting semiconductor laser chips present as an assemblage in a second wafer,
connecting the first and second wafers such that top sides of the pump devices face a surface emitting semiconductor laser chips,
singulating the connected wafers to form individual optoelectronic components,
forming recesses into the first wafer from the first radiation exit area at the top side of each pump device into semiconductor layers of each pump device,
providing resonator mirrors in each recess at side faces of each recess which face the semiconductor layers of each pump device, and
providing the resonator mirrors before the connected wafers are singulated into individual devices.

8. The method according to claim 7, wherein the first wafer is soldered to the second wafer.

9. The method according to claim 8, wherein, for providing the multiplicity of pump devices, a semiconductor laser structure comprising a first radiation-generating layer is deposited epitaxially on a growth substrate and a multiplicity of resonator mirrors are subsequently produced in the semiconductor laser structure by means of etching.

10. The method according to claim 9, wherein a coupling-out structure defines the first radiation exit areas of the multiplicity of pump devices between two resonator mirrors in each case.

11. The optoelectronic component according to claim 1, wherein the surface emitting semiconductor laser chip and the pump device are not monolithically integrated with one another.

12. The optoelectronic component according to claim 1, wherein the second radiation-generating layer comprises quantum wells and barrier layers, said barrier layers arranged between said quantum wells, and
wherein the surface emitting semiconductor laser chip is pumped by barrier pumping, in which the pump radiation is absorbed in the barrier layers between the quantum wells in the second radiation-generating layer.

13. An optoelectronic component comprising:
an optical pump device formed by an electrically pumped semiconductor laser chip and comprising a first radiation-generating layer and a first radiation exit area at a top side of the pump device, wherein electromagnetic radiation generated during the operation of the pump device is coupled out from the pump device through the first radiation exit area transversely and at least in part non-perpendicularly with respect to the first radiation-generating layer, and
a surface emitting semiconductor laser chip comprising a reflective layer sequence comprising a Bragg mirror, and a second radiation-generating layer, wherein:
the surface emitting semiconductor laser chip is fixed to the top side of the pump device,
the reflective layer sequence is arranged between the first radiation exit area and the second radiation-generating layer,
two resonator mirrors delimit the first radiation-generating layer in lateral direction
the two resonator mirrors run perpendicularly to the first radiation generating layer at least in places,
a solder layer is arranged between the pump device and the surface emitting semiconductor laser chip, and mechanically connects the solder layer, the pump device and the surface emitting semiconductor laser chip to one another,
a coupling-out structure is arranged between the resonator mirrors, by which a structure part of laser radiation circulating in the resonator delimited by the resonator mirrors is coupled out through the first radiation exit area,
the coupling-out structure completely severs the first radiation-generating layer;
the surface emitting semiconductor laser chip has the following layer sequence at a side facing the pump device:
a passivation layer formed with a dielectric layer,
an etching stop layer, and
the reflective layer sequence wherein
the passivation layer is arranged facing the pump device and the etching stop layer is arranged between the passivation layer and reflective layer sequence,
the layer sequence has a transmissivity of at least 85% for electromagnetic radiation coupled out from the pump device.

14. The optoelectronic component according to claim 13, wherein the pump device has a single laser resonator.

* * * * *